United States Patent
He et al.

(10) Patent No.: US 7,432,708 B2
(45) Date of Patent: Oct. 7, 2008

(54) TEMPERATURE CONTROL METHOD FOR A PERMANENT MAGNET ARRANGEMENT OF A MAGNETIC RESONANCE SYSTEM

(75) Inventors: Qiang He, Shenzhen (CN); Xiao Guang Liu, Shenzhen (CN); Hong Yi Zhu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/761,525

(22) Filed: Jun. 12, 2007

(65) Prior Publication Data

US 2007/0290685 A1      Dec. 20, 2007

(30) Foreign Application Priority Data

Jun. 12, 2006   (CN)   ................ 2006 1 0012201 A

(51) Int. Cl.
    *G01V 3/00*   (2006.01)
(52) U.S. Cl. ..................... 324/315; 324/300
(58) Field of Classification Search ......... 324/300–322; 600/407–455
    See application file for complete search history.

(56) References Cited

U.S. PATENT DOCUMENTS

| | | | |
|---|---|---|---|
| 5,652,517 A * | 7/1997 | Maki et al. ................. | 324/318 |
| 6,252,405 B1 * | 6/2001 | Watkins et al. ............. | 324/319 |
| 6,297,634 B1 * | 10/2001 | Aoki ......................... | 324/315 |
| 6,489,873 B1 * | 12/2002 | Kruip et al. ................ | 335/300 |
| 6,566,880 B1 * | 5/2003 | Kruip et al. ................ | 324/318 |
| 6,598,404 B2 * | 7/2003 | Kruip ........................ | 62/3.3 |
| 6,653,835 B2 * | 11/2003 | Roeckelein et al. ......... | 324/315 |
| 6,906,517 B1 * | 6/2005 | Huang et al. ............... | 324/315 |
| 6,992,483 B1 * | 1/2006 | Emeric et al. .............. | 324/300 |

FOREIGN PATENT DOCUMENTS

JP      99800973.3      5/2006

* cited by examiner

*Primary Examiner*—Brij B Shrivastav
(74) *Attorney, Agent, or Firm*—Schiff Hardin LLP

(57) ABSTRACT

In a temperature control method for magnetic field components of a permanent magnet arrangement of a magnetic resonance system, temperature stability of the magnetic field components is achieved by maintaining the temperature of the two sides of the magnetic field components constant, with a difference being maintained between the temperatures of the two sides of the magnetic field components so that a temperature gradient is formed within the magnetic field components. Once the temperature gradient is formed, dynamic temperature stability is established within the magnetic field component. When this dynamic temperature stability is broken by thermal disturbance, the temperature gradient allows the thermal disturbance to be quickly transmitted to the lower magnetic yoke and is further transmitted to the outside through the base of the magnetic resonance system so that the thermal disturbance is smoothed and dynamic temperature stability is reestablished.

6 Claims, 2 Drawing Sheets

TEMPERATURE CONTROL METHOD FOR A PERMANENT MAGNET ARRANGEMENT OF A MAGNETIC RESONANCE SYSTEM

BACKGROUND OF THE INVENTION

1. Field of the Invention

The present invention relates to a temperature control method for a magnetic resonance system, and more particularly to a temperature control method for magnetic field components of a permanent magnet arrangement of a magnetic resonance system.

2. Description of the Prior Art

The magnetic field component used to produce and regulate the magnetic field, including magnetic blocks, pole plates, magnet laminations and shim irons, is the core of a permanent magnetic resonance system. Referring to FIG. 1, in a typical permanent magnetic resonance system, magnetic blocks 20a, 20b, pole plates 30a, 30b, magnet laminations 40a, 40b and shim irons 50a, 50b are oppositely arranged in order on the lower and upper magnetic yokes 10a, 10b.

Stability is an important parameter of the magnetic field components. There are many external conditions that affect the stability of a permanent magnet and the most important one is the temperature stability. However the magnetic field components of a permanent magnet of a magnetic resonance system, in particular magnetic blocks 20a, 20b used to produce a magnetic field, are very sensitive to temperature change. The reason is that the characteristic of permanent magnet material changes notably with temperature, and thus the magnetic field excited by the magnet will change as well, which is reflected in fluctuation of magnetic field strength and decreased homogeneity. Such a change of the magnetic field will directly lead to decreased imaging quality of the magnetic resonance system.

To maintain the stability of the field strength, it is conventional to use insulating materials to cover the lower and upper magnetic yokes 10a, 10b and the magnetic field components, or to use a cooling or heating device either on or between the lower and upper magnetic yokes 10a, 10b to keep the temperature of the magnetic field components constant.

The method of using insulating materials to cover the lower and upper magnetic yokes 10a, 10b and magnetic field components not only increases the sizes of these components, but also does not achieve satisfactory results. This is because the insulating materials reduce the sensitivity of the magnetic field components to the surrounding temperature change, so they augment the effect of some heat producing parts in the magnetic resonance system, such as gradient coils 60a, 60b mounted on shim irons 50a, 50b as shown in FIG. 1, on the temperature stability of the magnetic field components.

The method of using a cooling device on the lower and upper magnetic yokes 10a, 10b makes it necessary to wrap the electronic cooling device around the entire length of the lower and upper magnetic yokes 10a, 10b to cool the magnetic field components down to within a temperature range of 10 to 50 degrees lower than the surrounding temperature, and to use insulating materials to cover the lower and upper magnetic yokes 10a, 10b to reduce the effect of the surrounding temperature change. The above cooling device method can achieve a better field stability result but the oversized structures and high power consumption greatly reduce its practicability.

Use of a heating device on or between the lower and upper magnetic yokes 10a, 10b is relatively simple in structure, as shown in FIG. 1. The heating elements 100a, 100b are fitted inside (or on the interior surface of) the lower and upper magnetic yokes 10a, 10b to control the temperature of the magnetic field components. Further, the heating elements 100a, 100b are connected to the temperature control units 70a, 70b, respectively, to control the temperature on a real-time basis. However, such a single-channel heating device is only capable of temperature control at a narrow range. When closed to the magnetic blocks 20a, 20b, the heating device is able to keep the temperature of the magnetic blocks 20a, 20b constant. However, the heating device no longer has effective control over the temperature of the magnetic blocks 20a, 20b at a certain distance away, and of those farther away, pole plates 30a, 30b, magnetic laminations 40a, 40b and shim irons 50a, 50b, and reacts quite slowly to the temperature change in these areas as well.

Chinese application No. 99800973.3 discloses an improvement over the above heating device and provides a multi-channel heating device. The multi-channel heating device provides heating elements within the lower and upper magnetic yokes 10a, 10b, magnetic blocks 20a, 20b and pole plates 30a, 30b to effectively keep the magnetic field components in a constant temperature state so that a stable field strength is obtained.

The constant temperature state of the magnetic field component achieved by using multi-channel heating devices, however, is only a static stable state by providing a heating element at both sides of the magnetic blocks 20a, 20b, for example, so as to force the magnetic blocks 20a, 20b into a static constant temperature state. If the static stable state is broken, However, for example if a thermal disturbance (sudden temperature change) occurs at the magnetic blocks 20a, 20b, and since both sides are forced into a static constant temperature state by the heating devices, the thermal disturbance will have a dramatic, concussive impact on the internal temperature stability of the magnetic blocks 20a, 20b. Such impact will have a severe effect on the size and homogeneity of the field strength and a longer time is needed to offset the impact.

SUMMARY OF THE INVENTION

An object of the present invention is to provide a temperature control method for magnetic field components of a magnetic resonance system that maintains a certain temperature difference between the two sides of the magnetic field components so that a temperature gradient is formed to achieve dynamic temperature stability, and hence a stable field strength.

This object is achieved in accordance with the present invention by a temperature control method for magnetic field components of a permanent magnetic resonance system, which, by maintaining the temperature of the two sides of the magnetic field components constant, achieves temperature stability of the magnetic field components by maintaining a difference between the temperatures of the two sides of the magnetic field components, so that a temperature gradient is formed within the magnetic field components.

Preferably, the magnetic resonance system has a lower and an upper magnetic yoke and the magnetic field-generating components are oppositely mounted on the lower and upper magnetic yokes wherein the temperature of the two sides of the magnetic field components gradually decreases toward the lower and upper magnetic yokes. The minimum value of the temperature of the two sides of the magnetic field components mounted on the lower magnetic yoke is smaller than that of the temperature of the two sides of the magnetic field components mounted on the upper magnetic yoke. Gradient coils are provided on the magnetic field components and an insulating sandwich is provided between the magnetic field components and gradient coils for thermal insulation. The temperature difference is obtained by providing a heating element at the two sides of the magnetic field components and corresponding temperature control units are connected to the heating elements to control their temperature.

The temperature gradient allows the temperature of the two sides of the magnetic field components to gradually decrease toward the lower and upper magnetic yokes, and by setting the minimum value of the temperature of the magnetic field component on the lower magnetic yoke lower than that of the magnetic field component on the upper magnetic yoke, a temperature gradient is also formed between the lower and upper magnetic yokes. Once the temperature gradient is formed, dynamic temperature stability is established within the magnetic field components. When this dynamic temperature stability is broken by thermal disturbance, the temperature gradient allows the thermal disturbance to be quickly transmitted to the lower magnetic yoke and is further transmitted to the outside through the base of the magnetic resonance system so that the thermal disturbance is smoothed and dynamic temperature stability is reestablished.

DESCRIPTION OF THE PREFERRED EMBODIMENTS

Unlike the prior art, wherein constant temperature control of magnetic field components and hence static temperature stability are achieved, the temperature control method for magnetic field components of a permanent magnet arrangement of a magnetic resonance system of the present invention maintains a temperature difference between the two ends of the magnetic field components to form a temperature gradient, and thus dynamic temperature stability is achieved.

Figure 1:
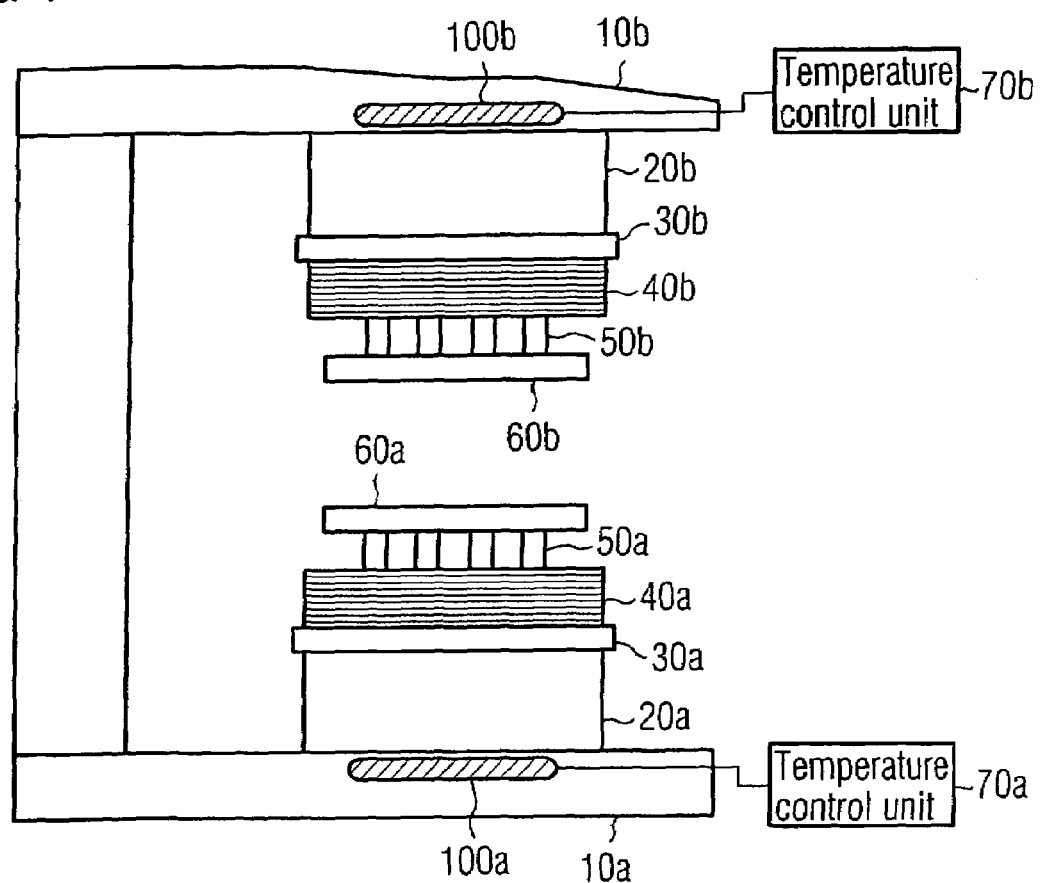
FIG. 1 is a schematic diagram illustrating an existing temperature control device for magnetic field components of a permanent magnet arrangement of a magnetic resonance system.
Figure 2:
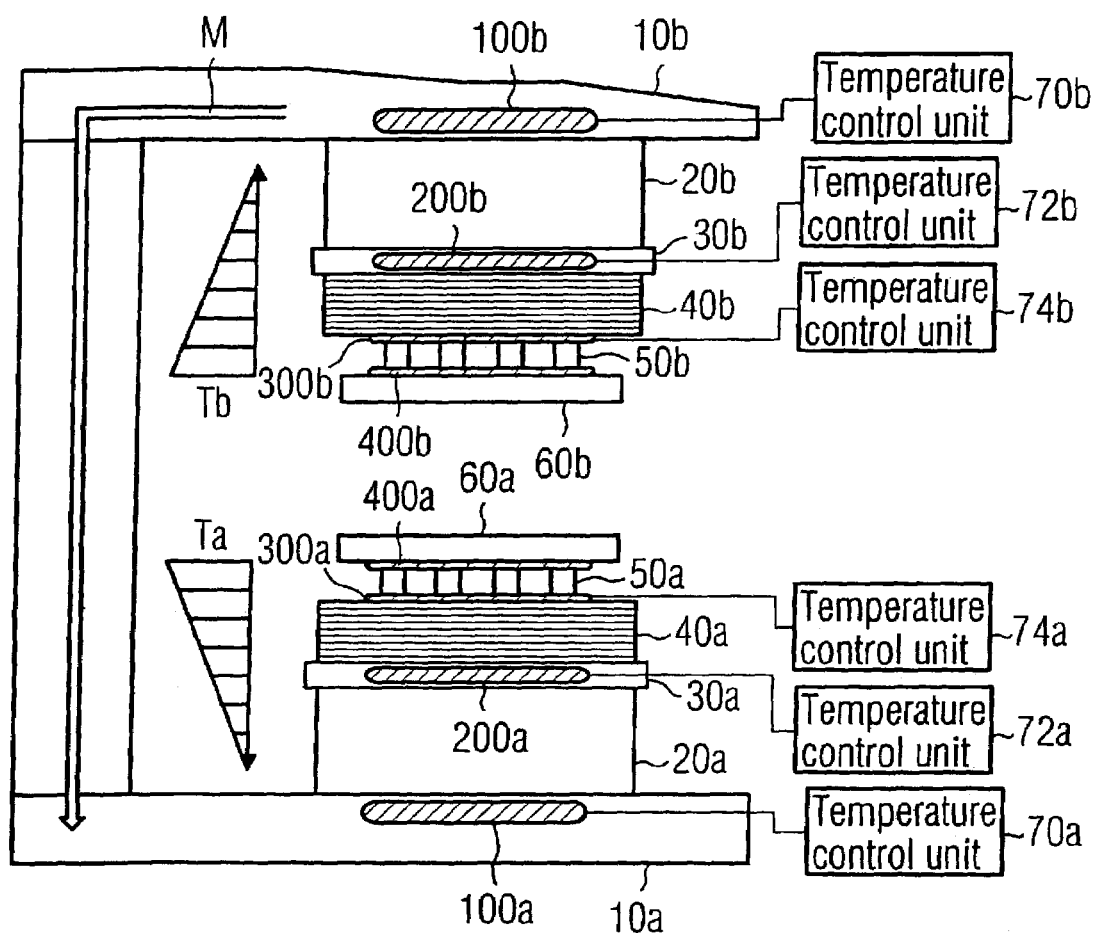
FIG. 2 is a schematic diagram illustrating a temperature control device for magnetic field components of a permanent magnet arrangement of a magnetic resonance system according to the present invention.

Referring to FIG. 2, in a magnetic resonance system of the type having a permanent magnet arrangement, the magnetic field components, i.e., the components that collectively participate in generating the basic magnetic field of the magnetic resonance system, such as magnetic blocks 20a, 20b, pole plates 30a, 30b, magnet laminations 40a, 40b and shim irons 50a, 50b, are oppositely arranged in sequence on the lower and upper magnetic yokes 10a, 10b. The gradient coils 60a, 60b of the magnetic resonance system are mounted on the shim irons 50a, 50b.

The two sides of the magnetic block 20a are provided with heating elements 100a and 200a, respectively, and there is temperature difference between the heating elements 100a and 200a so that a temperature gradient is formed within the magnetic block 20a. The heating element 100a preferably is mounted inside the lower magnetic yoke 10a, the heating element 200a preferably is mounted inside the pole plate 30a, and the heating temperature of the heating element 200a is preferably higher than that of the heating element 100a so that the temperature of the magnetic block 20a gradually decreases toward the lower magnetic yoke 10a.

Further, the two sides of the magnetic lamination 40a are provided with heating elements 200a and 300a, respectively, and there is temperature difference between the heating elements 200a and 300a so that a temperature gradient is formed within the magnetic lamination 40a. Wherein the heating element 200a preferably shares the heating element mounted inside the pole plate 30a, the heating element 300a is preferably mounted between the shim block 50a and the magnetic lamination 40a and the heating temperature of the heating element 300a is preferably higher than that of the heating element 200a so that the temperature of the magnetic lamination 40a gradually decreases toward the lower magnetic yoke 10a.

The heating elements 100a, 200a and 300a are separately connected to their corresponding temperature control units 70a, 72a and 74a. The temperature control units 70a, 72a and 74a are used for controlling the temperature of the heating elements 100a, 200a and 300a, respectively.

Still further, an insulation sandwich 400a is provided between the shim iron 50a and the gradient coil 60a to prevent the heat produced by the gradient coil 60a from being transmitted to other magnetic field elements through the shim iron 50a to affect their temperature stability.

Because the magnetic field components are symmetrically arranged, there are also heating elements 100b, 200b provided at the two ends of the magnetic block 20b and there is also a temperature difference between the heating elements 100b, 200b so that a temperature gradient is formed within the magnetic block 20b. The heating element 100b preferably is mounted inside the upper magnetic yoke 10b; the heating element 200b preferably is mounted inside the pole plate 30b; and the heating temperature of the heating element 200b is preferably higher than that of the heating element 100b so that the temperature of the magnetic block 20b gradually decreases toward the upper magnetic yoke 10b.

Further, the two sides of the magnetic lamination 40b are provided with heating elements 200b and 300b, respectively, and there is a temperature difference between the heating elements 200b and 300b so that a temperature gradient is formed within the magnetic lamination 40b. The heating element 200b preferably shares the heating element mounted inside the pole plate 30b, the heating element 300b is preferably mounted between the shim block 50b and the magnetic lamination 40b and the heating temperature of the heating element 300b is preferably higher than that of the heating element 200b so that the temperature of the magnetic lamination 40b gradually decreases toward the upper magnetic yoke 10b.

The heating elements 100b, 200b and 300b are connected to the temperature control units 70b, 72b and 74b, respectively. The temperature control units 70b, 72b and 74b are used to control the temperature of the heating elements 100b, 200b and 300b, respectively.

Still further, an insulation sandwich 400b is provided between the shim iron 50b and the gradient coil 60b to prevent the heat produced by the gradient coil 60b from being transmitted to other magnetic field elements through the shim iron 50b to affect their temperature stability.

Through the above arrangement, the temperature within the magnetic blocks 20a, 20b and magnetic lamination 40a and 40b and between the magnetic blocks 20a, 20b, pole plates 30a, 30b, magnetic laminations 40a, 40b and shim irons 50a, 50b gradually decreases toward the lower and upper magnetic yokes 10a, 10b to form temperature gradients Ta and Tb, and preferably the minimum value of the temperature gradually decreased toward the lower magnetic yoke 10a is smaller than that of the temperature gradually decreased toward the upper magnetic yoke 10b so that a temperature gradient is also formed between the lower magnetic yoke 10a and upper magnetic yoke 10b.

Once the temperature gradient is formed, dynamic temperature stability is established within the magnetic block 20a, magnetic lamination 40a and between the magnetic block 20a, pole plate 30a, magnetic lamination 40a and shim block 50a. When this dynamic temperature stability is broken by thermal disturbance, the temperature gradient Ta allows the thermal disturbance to be quickly transmitted to the lower magnetic yoke 10a and is further transmitted to the outside through the base of the magnetic resonance system so that the thermal disturbance is smoothed and the dynamic temperature stability is reestablished.

Similarly, once the temperature gradient is formed, dynamic temperature stability is established within the magnetic block 20b and magnetic lamination 40b and between the magnetic block 20b, pole plate 30b, magnetic lamination 40b and shim block 50b. When this dynamic temperature stability is broken by thermal disturbance, the temperature gradient Tb allows the thermal disturbance to be passed on to the upper magnetic yoke 10a and further to the lower magnetic yoke 10a in the direction shown by arrow M through the temperature gradient between the upper magnetic yoke 10b and lower magnetic yoke 10a, and finally to the outside through the base of the magnetic resonance system so that the thermal disturbance is smoothed and dynamic stability state is reestablished.

Due to air convection, the heat is easier to transmit from down to up. Therefore generally a greater temperature gradient is used at the top than below to enhance the ability of the system to counteract the temperature disturbance.

Part or all of the above heating elements may be used according to actual needs. When a magnetic resonance system does not have a high demand on the temperature stability, it may use just heating elements 100a, 100b. When a magnetic resonance system has a high demand on the temperature stability, it may use heating elements 100a, 100b, 200a and 200b. When a magnetic resonance system has a very high demand on the temperature stability, it may use all of the above heating elements.

Although modifications and changes may be suggested by those skilled in the art, it is the intention of the inventors to embody within the patent warranted hereon all changes and modifications as reasonably and properly come within the scope of their contribution to the art.

We claim as our invention:

1. A temperature control method for a magnetic resonance system having a permanent magnet arrangement comprising a first group of magnetic field-generating components and a second group of magnetic field-generating components, said first group of magnetic field-generating components and said second group of magnetic field-generating components, in combination, generating a basic magnetic field of said magnetic resonance system in a region between said first group and said second group, each of said first and second groups having two opposite sides with one of said two opposite sides of each group being closer to said region than the other of said two opposite sides of that group, said method comprising the steps of:

stabilizing temperature of said first group of magnetic field-generating components by maintaining respective temperatures at two opposite sides of said first group of magnetic field-generating components constant while maintaining a difference between the respective temperatures at said two opposite sides of said first group of magnetic field-generating components; and stabilizing temperature of said second group of magnetic field-generating components by maintaining respective temperatures at two opposite sides of said second group of magnetic field-generating components constant while maintaining a difference between the respective temperatures at said two opposite sides of said second group of magnetic field-generating components.

2. A temperature control method as claimed in claim 1 wherein said magnetic resonance system comprises an upper magnetic yoke at which said first group of magnetic field-generating components is mounted at one of said two sides of said first group of magnetic field-generating components, and a lower magnetic yoke at which said second group of magnetic field-generating components is mounted at one of said two sides of said second group of magnetic field-generating components, and comprising maintaining said difference between the respective temperatures at said two sides of said first group of magnetic field-generating components by maintaining a temperature gradient that decreases toward said one of said two sides of said first group of magnetic field-generating components, and maintaining said temperature difference between said two sides of said second group of magnetic field-generating components by maintaining a temperature gradient that decreases toward said one of said two sides of second group of magnetic field-generating components.

3. A temperature control method as claimed in claim 2 wherein said temperature gradient of said first group of magnetic field-generating components decreases to a first minimum and wherein said temperature gradient of said second group of magnetic field-generating components decreases to a second minimum, and wherein said second minimum is smaller than said first minimum.

4. A temperature control method as claimed in claim 2 wherein said magnetic resonance system comprises a first set of gradient coils, which generate heat during operation thereof, mounted at the other of said two sides of said first group of magnetic field-generating components, and a second set of gradient coils, which generate heat during operation thereof, mounted at the other of said two sides of said second group of magnetic field-generating components, and comprising thermally insulating said first group of magnetic field-generating components from said first set of gradient coils with an insulating layer sandwiched between said first group of magnetic field-generating components and said first set of gradient coils, and thermally insulating said second group of magnetic field-generating components from said second set of gradient coils with an insulating layer sandwiched between said second group of magnetic field-generating components and said second set of gradient coils.

5. A temperature control method as claimed in claim 1 comprising maintaining said difference between the respective temperatures at said two sides of said first group of magnetic field-generating components by operating first heating elements respectively mounted at said two sides of said first group of magnetic field-generating components, and maintaining said difference between the respective temperatures at said two sides of said second group of magnetic field-generating components by operating second heating elements respectively disposed at said two sides of said second group of magnetic field-generating components.

6. A temperature control method as claimed in claim 5 comprising operating said first heating elements with a first temperature control unit connected thereto, and operating said second heating elements with a second temperature control unit connected thereto.

* * * * *